(12) United States Patent
Cao et al.

(10) Patent No.: US 11,171,171 B2
(45) Date of Patent: Nov. 9, 2021

(54) X-RAY DETECTOR

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

(*) Notice: Subject to any disclaimer, the term of this patent is extended or adjusted under 35 U.S.C. 154(b) by 4 days.

(21) Appl. No.: 16/742,771

(22) Filed: Jan. 14, 2020

(65) Prior Publication Data

US 2020/0152688 A1 May 14, 2020

Related U.S. Application Data

(63) Continuation of application No. PCT/CN2017/094439, filed on Jul. 26, 2017.

(51) Int. Cl.
*H01L 27/146* (2006.01)
*G01T 1/24* (2006.01)

(52) U.S. Cl.
CPC ........ *H01L 27/14636* (2013.01); *G01T 1/247* (2013.01); *H01L 27/14634* (2013.01); *H01L 27/14659* (2013.01); *H01L 27/14661* (2013.01); *H01L 27/14676* (2013.01)

(58) Field of Classification Search
CPC ......... H01L 27/14636; H01L 27/14634; H01L 27/14659; H01L 27/14661; H01L 27/14676; G01T 1/247; G01T 1/24
See application file for complete search history.

(56) References Cited

U.S. PATENT DOCUMENTS

| 5,245,191 A | 9/1993 | Barber et al. |
| 2011/0121191 A1* | 5/2011 | Kappler ............ G01T 1/17 250/370.09 |
| 2012/0211663 A1* | 8/2012 | Kim ................ H01L 27/14632 250/370.13 |

(Continued)

FOREIGN PATENT DOCUMENTS

| CN | 1675780 A | 9/2005 |
| CN | 103430533 A | 12/2013 |

(Continued)

*Primary Examiner* — Kiho Kim
(74) *Attorney, Agent, or Firm* — IPro, PLLC; Qian Gu

(57) ABSTRACT

Disclosed herein is an apparatus suitable for detecting X-ray. The apparatus may comprise an X-ray absorption layer, an electronics layer and a distribution layer. The X-ray absorption layer may comprise a first plurality of electric contacts and configured to generate electrical signals on the first plurality of electric contacts from X-ray incident on the X-ray absorption layer. The electronics layer may comprise a second plurality of electric contacts and an electronic system, wherein the electric system electrically connects to the second plurality of electric contacts and is configured to process or interpret the electrical signals. The first plurality of electric contacts and the second plurality of electric contacts have different spatial distributions. The distribution layer is configured to electrically connect the first plurality of electric contacts to the second plurality of electric contacts.

32 Claims, 14 Drawing Sheets

(56) References Cited

U.S. PATENT DOCUMENTS

2012/0223241 A1\* 9/2012 Kim .................. H01L 27/14676
250/370.09

FOREIGN PATENT DOCUMENTS

| DE | 102018219577 A1 \* | 5/2020 | ............. G01T 1/242 |
| EP | 2560026 B1 | 11/2014 | |
| JP | 2002217444 A | 8/2002 | |
| WO | 2016161542 A1 | 10/2016 | |

\* cited by examiner

X-RAY DETECTOR

TECHNICAL FIELD

The disclosure herein relates to an X-ray detector, particularly relates to an X-ray detector with a signal routing structure.

BACKGROUND

X-ray detectors may be devices used to measure the flux, spatial distribution, spectrum or other properties of X-rays.

X-ray detectors may be used for many applications. One important application is imaging. X-ray imaging is a radiography technique and can be used to reveal the internal structure of a non-uniformly composed and opaque object such as the human body.

Early X-ray detectors for imaging include photographic plates and photographic films. A photographic plate may be a glass plate with a coating of light-sensitive emulsion. Although photographic plates were replaced by photographic films, they may still be used in special situations due to the superior quality they offer and their extreme stability. A photographic film may be a plastic film (e.g., a strip or sheet) with a coating of light-sensitive emulsion.

In the 1980s, photostimulable phosphor plates (PSP plates) became available. A PSP plate may contain a phosphor material with color centers in its lattice. When the PSP plate is exposed to X-ray, electrons excited by X-ray are trapped in the color centers until they are stimulated by a laser beam scanning over the plate surface. As the plate is scanned by laser, trapped excited electrons give off light, which is collected by a photomultiplier tube. The collected light is converted into a digital image. In contrast to photographic plates and photographic films, PSP plates can be reused.

Another kind of X-ray detectors are X-ray image intensifiers. Components of an X-ray image intensifier are usually sealed in a vacuum. In contrast to photographic plates, photographic films, and PSP plates, X-ray image intensifiers may produce real-time images, i.e., do not require post-exposure processing to produce images. X-ray first hits an input phosphor (e.g., cesium iodide) and is converted to visible light. The visible light then hits a photocathode (e.g., a thin metal layer containing cesium and antimony compounds) and causes emission of electrons. The number of emitted electrons is proportional to the intensity of the incident X-ray. The emitted electrons are projected, through electron optics, onto an output phosphor and cause the output phosphor to produce a visible-light image.

Scintillators operate somewhat similarly to X-ray image intensifiers in that scintillators (e.g., sodium iodide) absorb X-ray and emit visible light, which can then be detected by a suitable image sensor for visible light. In scintillators, the visible light spreads and scatters in all directions and thus reduces spatial resolution. Reducing the scintillator thickness helps to improve the spatial resolution but also reduces absorption of X-ray. A scintillator thus has to strike a compromise between absorption efficiency and resolution.

Semiconductor X-ray detectors largely overcome this problem by direct conversion of X-ray into electric signals. A semiconductor X-ray detector may include a semiconductor layer that absorbs X-ray in wavelengths of interest. When an X-ray photon is absorbed in the semiconductor layer, multiple charge carriers (e.g., electrons and holes) are generated and swept under an electric field towards electric contacts on the semiconductor layer. Cumbersome heat management required in currently available semiconductor X-ray detectors (e.g., Medipix) can make a detector with a large area and a large number of pixels difficult or impossible to produce.

SUMMARY

Disclosed herein is an apparatus suitable for detecting X-ray, comprising: an X-ray absorption layer comprising a first plurality of electric contacts and configured to generate electrical signals on the first plurality of electric contacts from X-ray incident on the X-ray absorption layer; an electronics layer comprising a second plurality of electric contacts and an electronic system, wherein the electric system electrically connects to the second plurality of electric contacts and is configured to process or interpret the electrical signals; a distribution layer configured to electrically connect the first plurality of electric contacts to the second plurality of electric contacts, wherein the X-ray absorption layer or the electronics layer comprises the distribution layer; wherein the first plurality of electric contacts and the second plurality of electric contacts have different spatial distributions.

According to an embodiment, a number density of the first plurality of electric contacts is lower than a number density of the second plurality of electric contacts.

According to an embodiment, the X-ray absorption layer comprises the distribution layer.

According to an embodiment, the distribution layer comprises a plurality of vias aligned and connected to the first plurality of electric contacts.

According to an embodiment, the distribution layer further comprises a plurality of conductive pads, wherein the vias are connected to the conductive pads.

According to an embodiment, the second plurality of electric contacts are bonded to the conductive pads.

According to an embodiment, the electronics layer comprises the distribution layer.

According to an embodiment, the distribution layer comprises a plurality of vias aligned and connected to the second plurality of electric contacts.

According to an embodiment, the distribution layer further comprises a plurality of conductive pads, wherein the vias are connected to the conductive pads.

According to an embodiment, the first plurality of electric contacts are bonded to the conductive pads.

Disclosed herein is an apparatus suitable for detecting X-ray, comprising: an X-ray absorption layer comprising a first plurality of electric contacts and configured to generate electrical signals on the first plurality of electric contacts from X-ray incident on the X-ray absorption layer; an electronics layer comprising a second plurality of electric contacts and an electronic system, wherein the electric system electrically connects to the second plurality of electric contacts and is configured to process or interpret the electrical signals; wherein the first plurality of electric contacts and the second plurality of electric contacts have different spatial distributions; a board comprising a distribution layer, wherein the distribution layer is configured to electrically connect the first plurality of electric contacts to the second plurality of electric contacts, wherein at least one of the X-ray absorption layer and the electronics layer is embedded in the board, wherein the board comprises an electrically insulating material.

According to an embodiment, a number density of the first plurality of electric contacts is lower than a number density of the second plurality of electric contacts.

According to an embodiment, the absorption layer is embedded in the board.

According to an embodiment, the distribution layer comprises a plurality of vias aligned and connected to the first plurality of electric contacts.

According to an embodiment, the distribution layer further comprises a plurality of conductive pads, wherein the vias are connected to the conductive pads.

According to an embodiment, the second plurality of electric contacts are bonded to the conductive pads.

According to an embodiment, the electronics layer is embedded in the board.

According to an embodiment, the distribution layer comprises a plurality of vias aligned and connected to the second plurality of electric contacts.

According to an embodiment, the distribution layer further comprises a plurality of conductive pads, wherein the vias are connected to the conductive pads.

According to an embodiment, the first plurality of electric contacts are bonded to the conductive pads.

According to an embodiment, the electrically insulating material is a resin, a fiberglass, a plastic, or a ceramic.

According to an embodiment, the board is flexible.

According to an embodiment, the electronics system of any one of the apparatuses above comprises: a first voltage comparator configured to compare a voltage of at least one electric contact of the first plurality of electric contacts to a first threshold; a second voltage comparator configured to compare the voltage to a second threshold; a counter configured to register a number of X-ray photons reaching the absorption layer; a controller; wherein the controller is configured to start a time delay from a time at which the first voltage comparator determines that an absolute value of the voltage equals or exceeds an absolute value of the first threshold; wherein the controller is configured to activate the second voltage comparator during the time delay; wherein the controller is configured to cause the number registered by the counter to increase by one, if the second voltage comparator determines that an absolute value of the voltage equals or exceeds an absolute value of the second threshold.

According to an embodiment, the electronics system further comprises a plurality of capacitor modules, each of which is electrically connected to one of the first plurality of electric contacts, wherein the capacitor modules are configured to respectively collect charge carriers from the first plurality of electric contacts.

According to an embodiment, the controller is configured to activate the second voltage comparator at a beginning or expiration of the time delay.

According to an embodiment, the electronics system further comprises a voltmeter, wherein the controller is configured to cause the voltmeter to measure the voltage upon expiration of the time delay.

According to an embodiment, the controller is configured to determine an X-ray photon energy based on a value of the voltage measured upon expiration of the time delay.

According to an embodiment, the controller is configured to connect the electric contact to an electrical ground.

According to an embodiment, a rate of change of the voltage is substantially zero at expiration of the time delay.

According to an embodiment, a rate of change of the voltage is substantially non-zero at expiration of the time delay.

According to an embodiment, the capacitor modules are configured to compensate for variation in capacitances of circuits between the capacitor modules and the first plurality of electric contacts.

According to an embodiment, the controller is configured to determine the X-ray photon energy by multiplying a factor to the value of the voltage measured upon expiration of the time delay, wherein the factor is determined based on capacitances of circuits between the electronics system and the first plurality of electric contacts.

DETAILED DESCRIPTION

Figure 1A:
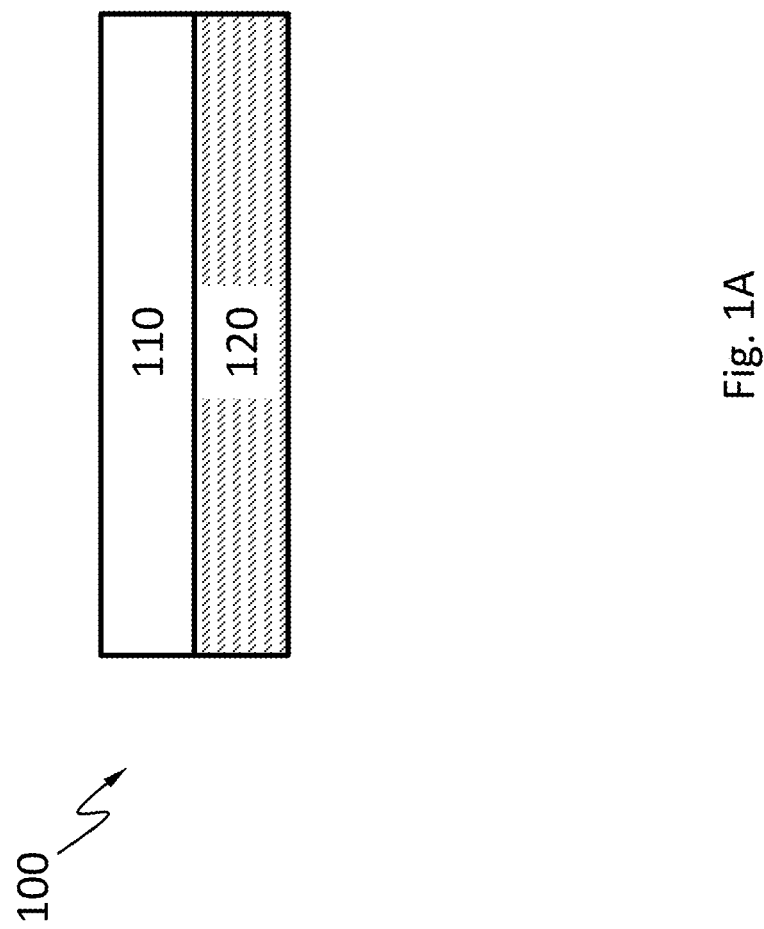
FIG. 1A schematically shows a cross-sectional view of the detector, according to an embodiment.

FIG. 1A schematically shows a cross-sectional view of the detector 100, according to an embodiment. The detector 100 may include an X-ray absorption layer 110 and an electronics layer 120 (e.g., an ASIC) for processing or analyzing electrical signals incident X-ray generates in the X-ray absorption layer 110. In an embodiment, the detector 100 does not comprise a scintillator. The X-ray absorption layer 110 may include a semiconductor material such as, silicon, germanium, GaAs, CdTe, CdZnTe, or a combination thereof. The semiconductor may have a high mass attenuation coefficient for the X-ray energy of interest.

Figure 1B:
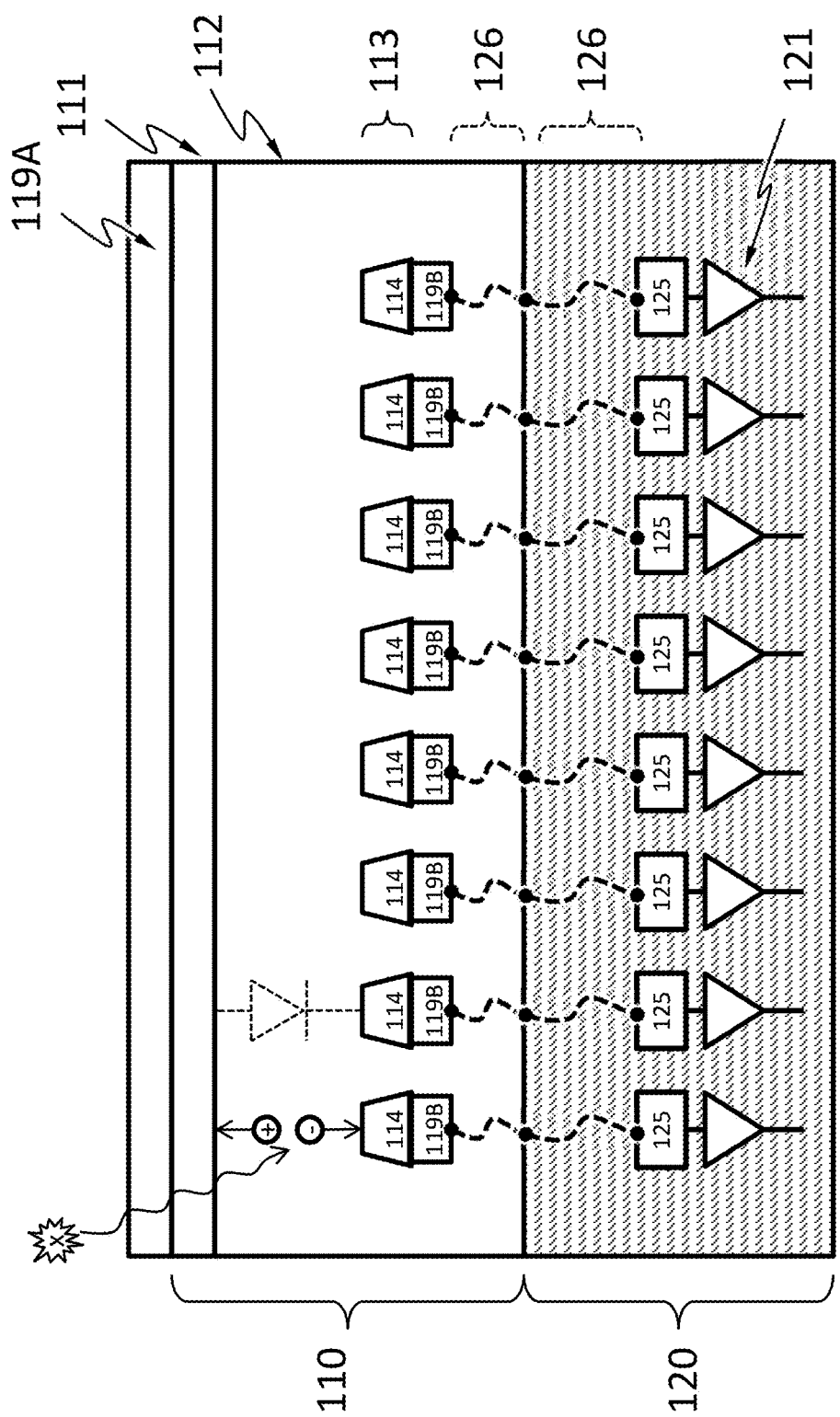
FIG. 1B schematically shows a detailed cross-sectional view of the X-ray absorption layer and the electronics layer and their connection, according to an embodiment.

As shown in a detailed cross-sectional view of the detector 100 in FIG. 1B, according to an embodiment, the X-ray absorption layer 110 may comprise an electric contact 119A, a first plurality of electric contacts 119B and one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete portions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 1B, each of the discrete regions 114 of the second doped region 113 forms a diode with the first doped region 111 and the optional intrinsic region 112. Namely, in the example in FIG. 1B, the X-ray absorption layer 110 has a plurality of diodes having the first doped region 111 as a shared electrode. The first doped region 111 may also have discrete portions. In the example in FIG. 1B, the X-ray absorption layer 110 has the 119A as a shared electric contact. The electric contact 119A may also have discrete portions. The first plurality of electric contacts 119B are in electric contact with the discrete regions 114.

When an X-ray photon hits the X-ray absorption layer 110 including diodes, the X-ray photon may be absorbed and generate one or more charge carriers by a number of mechanisms. An X-ray photon may generate 10 to 100000 charge carriers. The charge carriers may drift to the electrodes of one of the diodes under an electric field and become electrical signals on the electric contacts 119A and 119B. The field may be an external electric field. In an embodiment, the charge carriers may drift in directions such that the charge carriers generated by a single X-ray photon are not substantially shared by two different discrete regions 114 ("not substantially shared" here means less than 2%, less than 0.5%, less than 0.1%, or less than 0.01% of these charge carriers flow to a different one of the discrete regions 114 than the rest of the charge carriers). Charge carriers generated by an X-ray photon incident around the footprint of one of these discrete regions 114 are not substantially shared with another of these discrete regions 114.

Figure 1C:
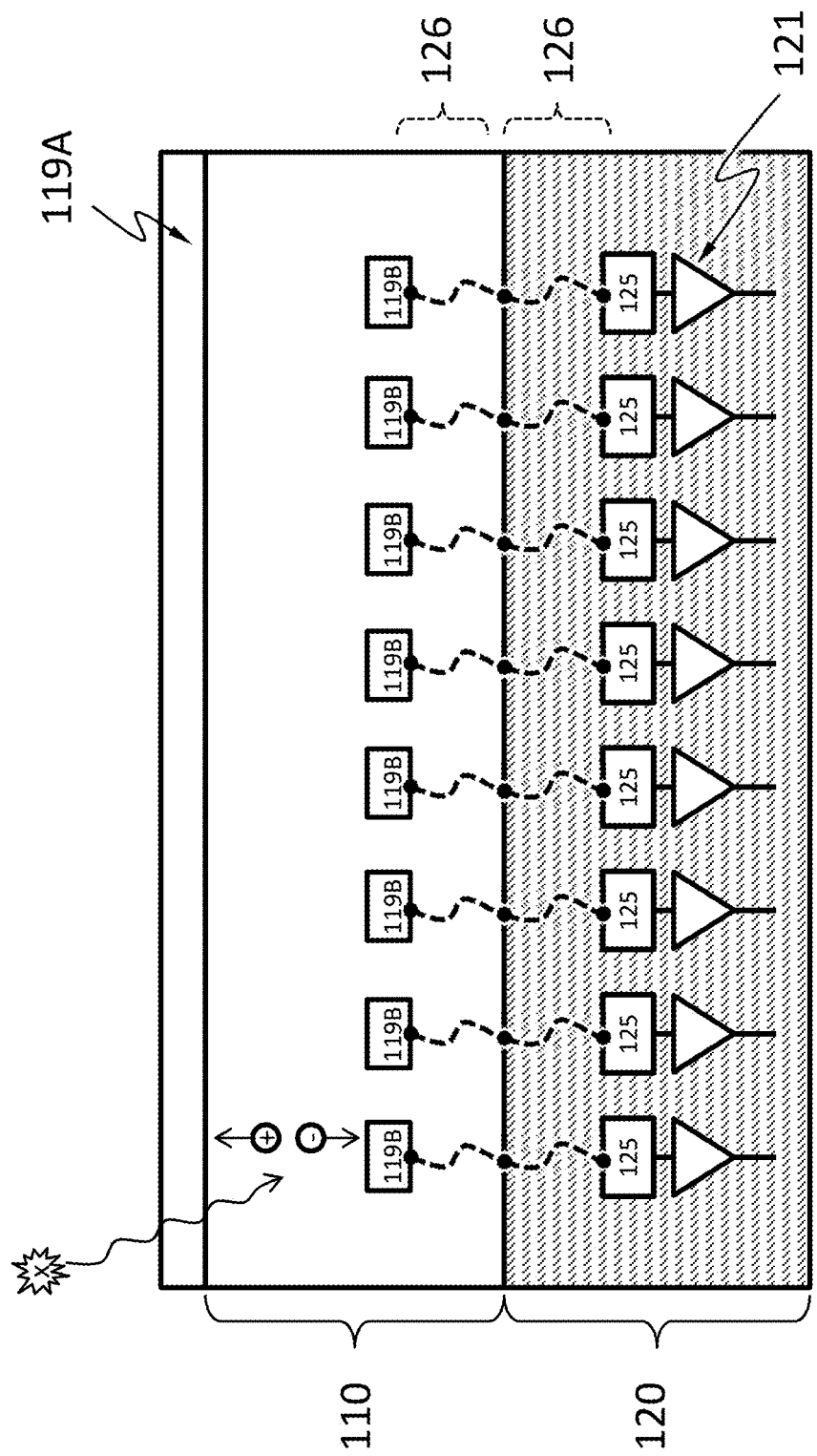
FIG. 1C schematically shows a detailed cross-sectional view of the X-ray absorption layer and the electronics layer and their connection, according to an embodiment.

As shown in an alternative detailed cross-sectional view of the detector 100 in FIG. 1C, according to an embodiment, the X-ray absorption layer 110 may include a resistor of a semiconductor material such as, silicon, germanium, GaAs, CdTe, CdZnTe, or a combination thereof, but does not include a diode. The semiconductor may have a high mass attenuation coefficient for the X-ray energy of interest.

When an X-ray photon hits the X-ray absorption layer 110 including a resistor but not diodes, it may be absorbed and generate one or more charge carriers by a number of mechanisms. An X-ray photon may generate 10 to 100000 charge carriers. The charge carriers may drift to the electric contact 119A and the first plurality of electric contacts 119B under an electric field. The field may be an external electric field. In an embodiment, the charge carriers may drift in directions such that the charge carriers generated by a single X-ray photon are not substantially shared by two different electric contacts of the first plurality of electric contacts 119B ("not substantially shared" here means less than 2%, less than 0.5%, less than 0.1%, or less than 0.01% of these charge carriers flow to a different one of the discrete portions than the rest of the charge carriers). Charge carriers generated by an X-ray photon incident around the footprint of one of the first plurality of electric contacts 119B are not substantially shared with another of these first plurality of electric contacts 119B.

The electronics layer 120 may include an electronic system 121 suitable for processing or interpreting signals generated by X-ray photons incident on the X-ray absorption layer 110. The electronics layer 120 may comprise a second plurality of electric contacts 125 connecting to the electric system 121. The electronic system 121 may include an analog circuitry such as a filter network, amplifiers, integrators, and comparators, or a digital circuitry such as a microprocessors, and memory. The electronic system 121 may include components dedicated to each of the second plurality of electric contacts 125 or components shared by the second plurality of electric contacts 125.

In an embodiment, the spatial distribution of the first plurality of electric contacts 119B on the X-ray absorption layer 110 may differ from the spatial distribution of the second plurality of electric contacts 125 on the electronics layer 120. For example, the first plurality of electric contacts 119B has a number density lower than the number density of the second plurality of electric contacts 125. In an embodiment, the X-ray absorption layer 110 or the electronics layer 120 may comprise a distribution layer 126 configured to electrically connect the first plurality of electric contacts 119B to the second plurality of electric contacts 125.

Figure 2A:
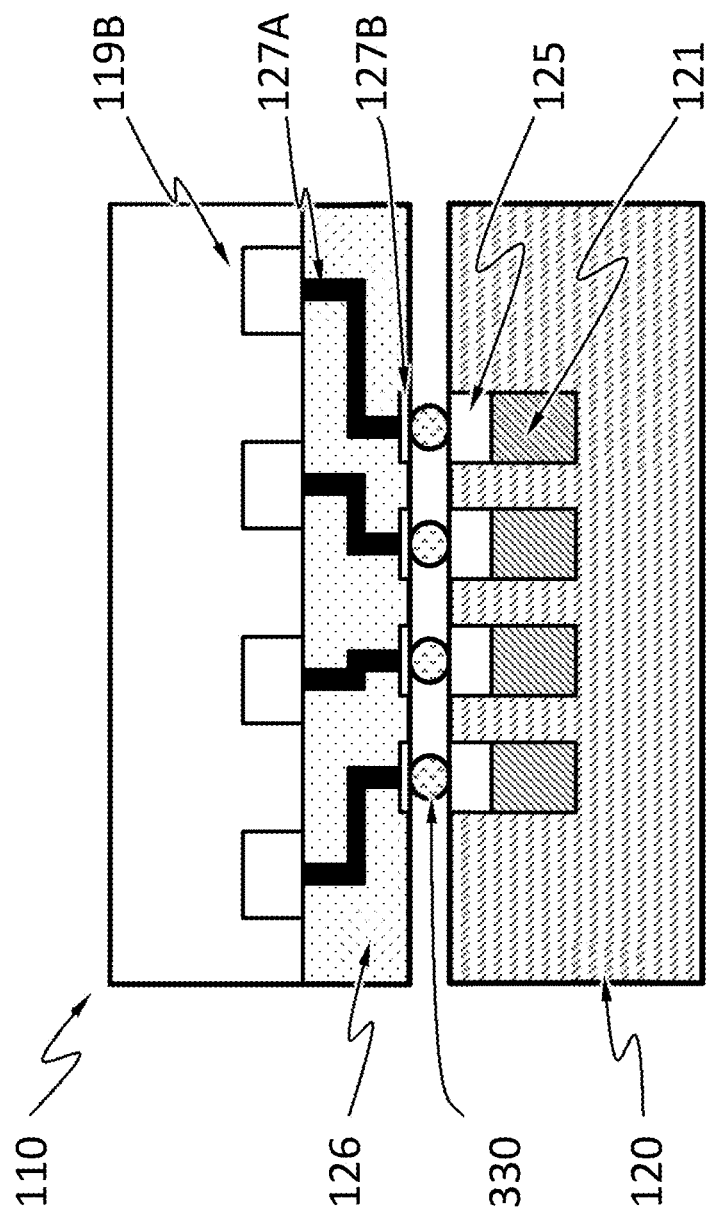
FIG. 2A and FIG. 2B each schematically shows a form of electrical connection between the electronics layer and the X-ray absorption layer, according to an embodiment.

As shown in a detailed cross-sectional view of the detector 100 in FIG. 2A, according to an embodiment, the X-ray absorption layer 110 comprises the distribution layer 126 (i.e., the distribution layer 126 is formed on the same substrate as the rest of the X-ray absorption layer 110). The distribution layer 126 may comprise a plurality of vias 127A aligned and connected to the first plurality of electric contacts 119B. The distribution layer 126 may also comprise a plurality of conductive pads 127B connected to the vias 127A and bonded to the second plurality of electric contacts 125. The distribution layer 126 may have multiple alternating layers of vias 127A and connections in between. The vias 127A and conductive pads 127B may include electrically conductive materials such as copper and aluminum. The distribution layer 126 may comprise an electrically insulating material (e.g. silicon dioxide) in which the vias 127A and conductive pads 127B are embedded.

The bonding of the X-ray absorption layer 110 to the electronics layer 120 may be by a suitable technique such as direct bonding, wire bonding or flip chip bonding.

Direct bonding is a wafer bonding process without any additional intermediate layers (e.g., solder bumps). The bonding process is based on chemical bonds between two surfaces. Direct bonding may be at elevated temperature but not necessarily so.

Wire bonding is a bonding process using wire bonds (e.g., gold wires and copper wires) to connect the X-ray absorption layer 110 to the electronics layer 120. The wire bonds may be fixed and secured with an electrically insulating material such as epoxy.

Flip chip bonding uses solder bumps 330 deposited onto contact pads (e.g., the conductive pads 127B of the distribution layer 126). Either the X-ray absorption layer 110 or the electronics layer 120 is flipped over and the contact pads of each layer are aligned. The solder bumps 330 may be melted to solder together the contact pads of the X-ray absorption layer 110 and the electronics layer 120. Any void space among the solder bumps 330 may be filled with an insulating material.

Figure 2B:
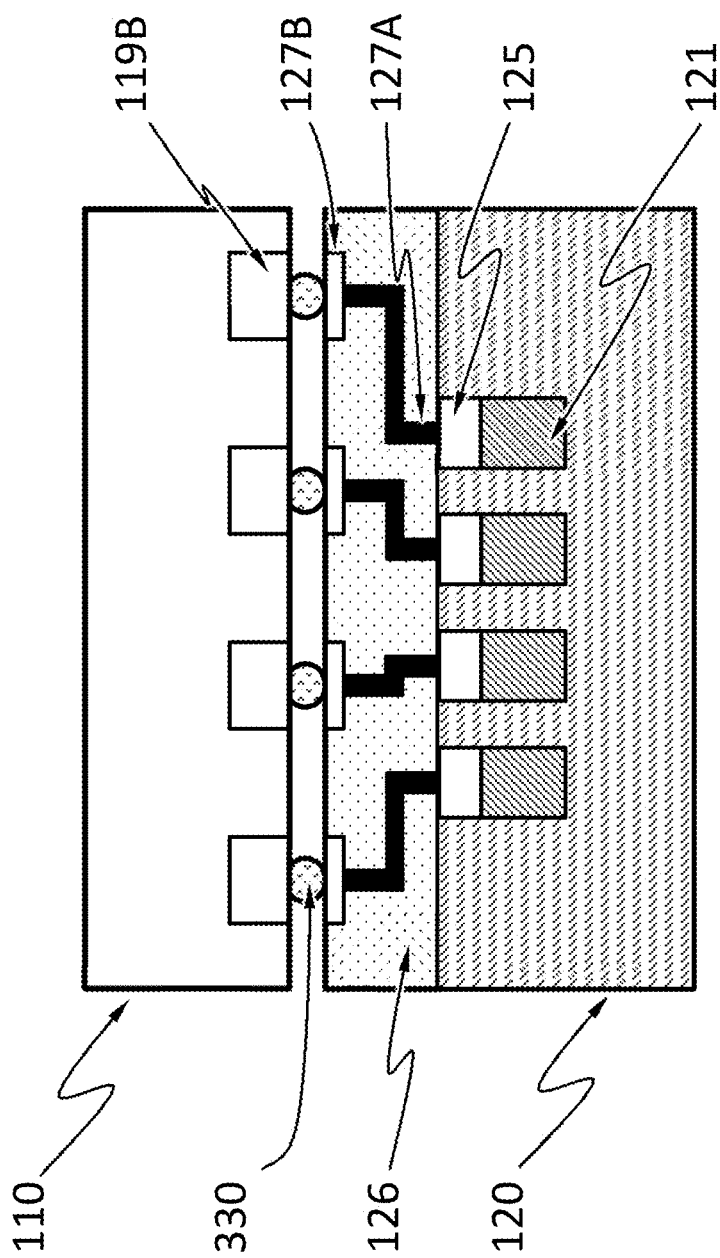

As shown in a detailed cross-sectional view of the detector 100 in FIG. 2B, according to an embodiment. The structure shown in FIG. 2B is similar to the structure in FIG. 2A expect that the electronics layer 120 comprises the distribution layer 126 (i.e., the distribution layer 126 is formed on the same substrate as the rest of the electronics layer 120). The distribution layer 126 may comprise a plurality of vias 127A aligned and connected to the second plurality of electric contacts 125. The distribution layer 126 may also comprise a plurality of conductive pads 127B connected to the vias 127A and bonded to the first plurality of electric contacts 119B.

In an embodiment, the distribution layer 126 may be embedded in a board of an electrically insulating material 399. At least one of the X-ray absorption layer 110 and the electronics layer 120 is also embedded in the board 399. The board 399 may be any suitable materials, such as a resin, a fiberglass, a plastic, and a ceramic. If the detector 100 is small, or multiple chips including the electronics layer 120 and the X-ray absorption layer 110 are used, the board 399 may be flexible and the detector 100 may remain functional even if the board 399 is bent.

Figure 3A:
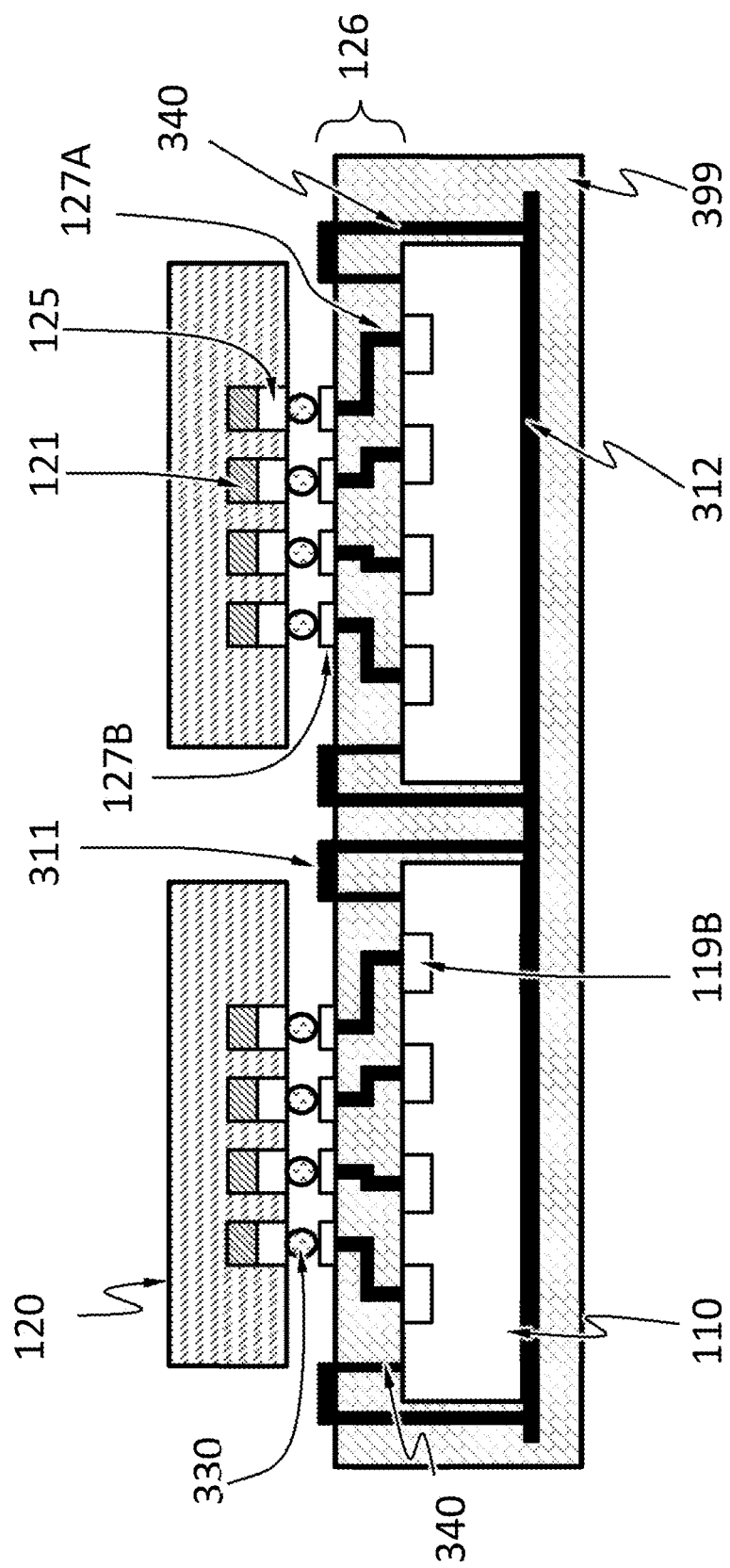
FIG. 3A-FIG. 3E each schematically shows a form of electrical connection between the electronics layer and the X-ray absorption layer of the detector comprising a board, according to an embodiment.

As shown in a detailed cross-sectional view of the detector 100 in FIG. 3A, according to an embodiment, the distribution layer 126 is part of the board 399 and the X-ray absorption layer 110 is embedded in the board 399. Various interconnects (e.g., transmission lines 311 and 312, vias 340, vias 127A of the distribution layer 126) may be formed in the board 399. Conductive pads 127B of the distribution layer 126 may be formed in the board 399. The vias 127A may be aligned and connected to the first plurality of electric contacts 119B and connected to the conductive pads 127B. The distribution layer 126 may have multiple alternating layers of vias 127A and connections in between. The electronics layer 120 may be bonded to the board 399 such that the second plurality of electric contacts 125 are electrically connected to the conductive pads 127B of the distribution layer 126. The bonding of the X-ray absorption layer 110 to the electronics layer 120 may be by a suitable technique such as direct bonding or flip chip bonding. The transmission lines 311 may electrically connect the vias 340 to the transmission lines 312. The transmission lines 311 and 312 may electrically connect the diodes or resistors of the X-ray absorption layer to outside circuitry. The transmission lines 312 in the board 399 may be arranged in different depths from the surface of the board 399—the transmission lines 312 may be arranged in different layers.

Figure 3B:
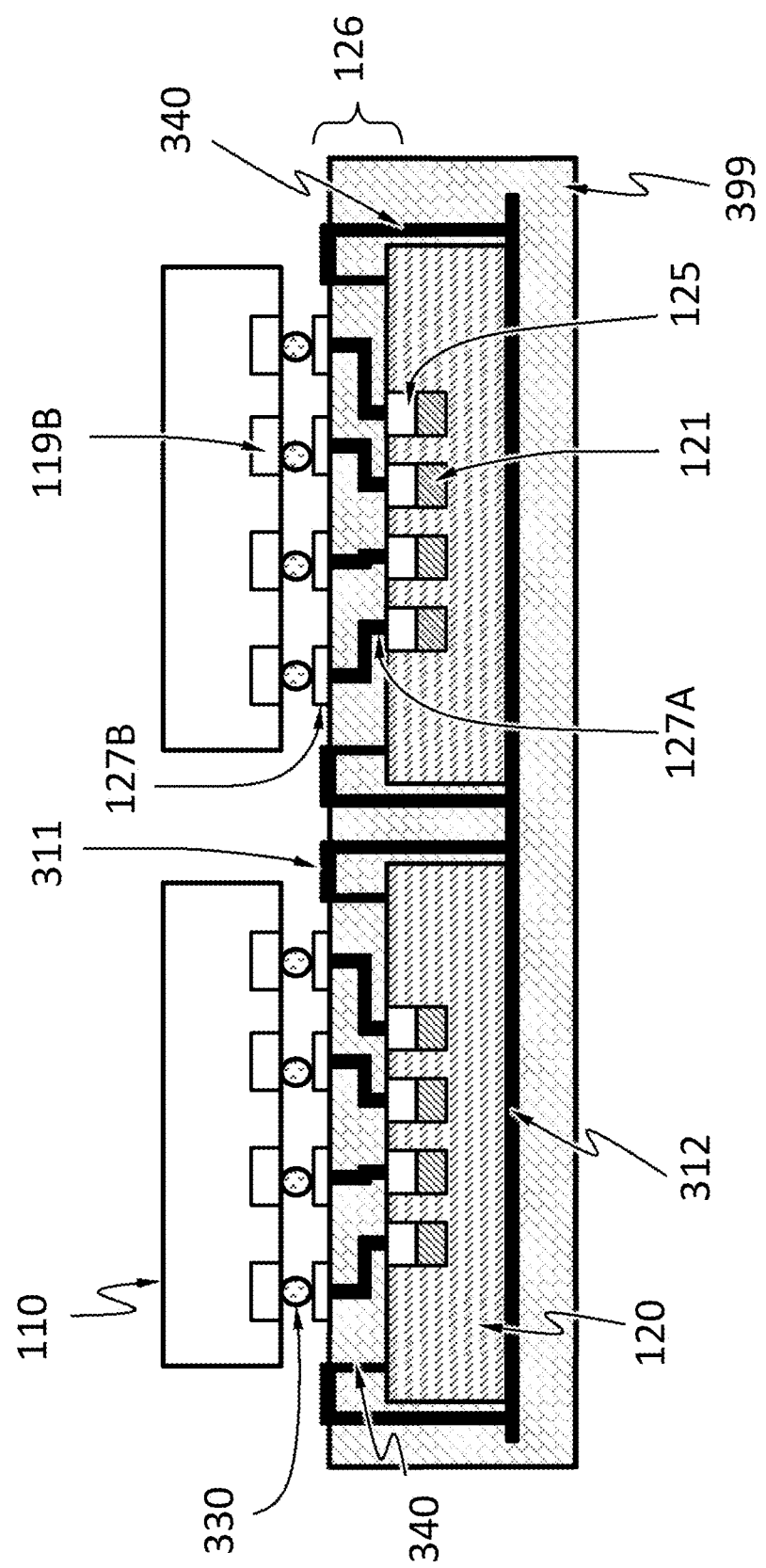

As shown in a detailed cross-sectional view of the detector 100 in FIG. 3B, according to an embodiment, the distribution layer 126 and the electronics layer 120 are embedded in the board 399. The structure shown in FIG. 3B is similar to the structure in FIG. 3A except that the electronics layer 120 is embedded in the board 399 and the X-ray absorption layer 110 is mounted on the board and bonded to the distribution layer 126.

Figure 3C:
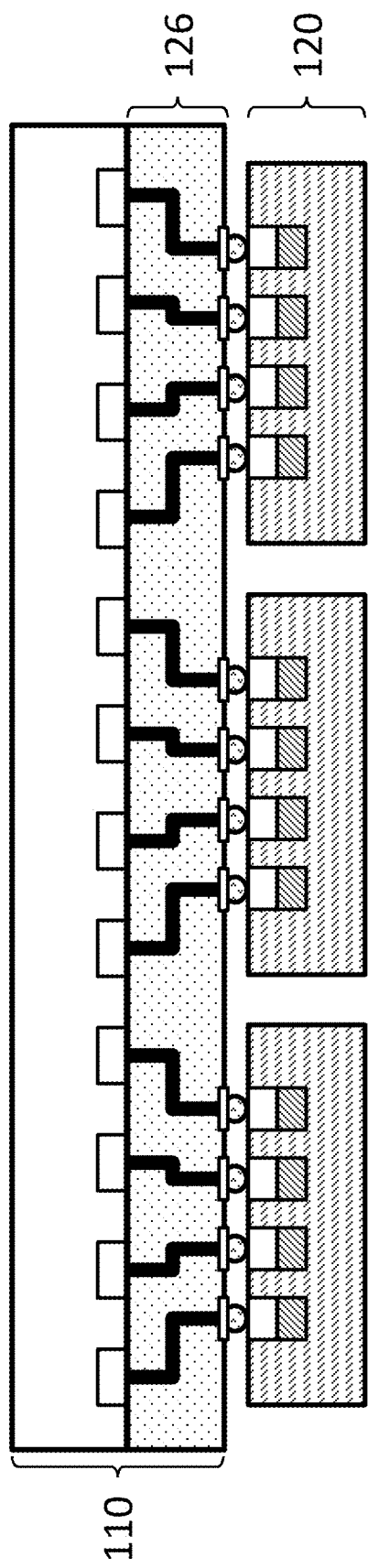

As shown in a detailed cross-sectional view of the detector 100 in FIG. 3C, according to an embodiment, multiple chips including the electronics layer 120 may be bonded to a substrate including the X-ray absorption layer 110. The X-ray absorption layer 110 extends across the multiple chips. The X-ray absorption layer 110 comprises the distribution layer 126 (i.e., the distribution layer 126 is formed on the same substrate as the rest of the X-ray absorption layer 110). The details of the distribution layer 126 are shown in FIG. 2A.

Figure 3D:
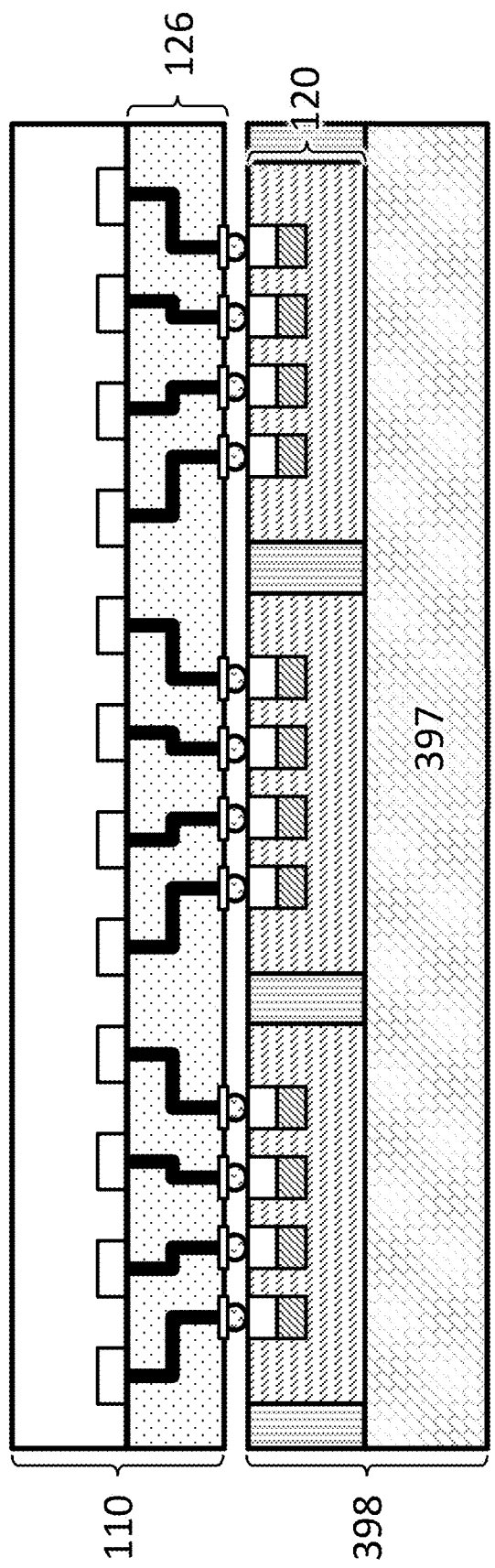

As shown in a detailed cross-sectional view of the detector 100 in FIG. 3D, according to an embodiment, multiple chips including the electronics layer 120 may be reconstructed into a wafer 398. The wafer 398 is bonded to a substrate including the X-ray absorption layer 110. The X-ray absorption layer 110 extends across the multiple chips. The X-ray absorption layer 110 comprises the distribution layer 126 (i.e., the distribution layer 126 is formed on the same substrate as the rest of the X-ray absorption layer 110). The details of the distribution layer 126 are shown in FIG. 2A. Wafer reconstruction is a process of forming an integral wafer by attaching multiple chips to a supporting wafer 397 and filling the gaps between the chips.

Figure 3E:
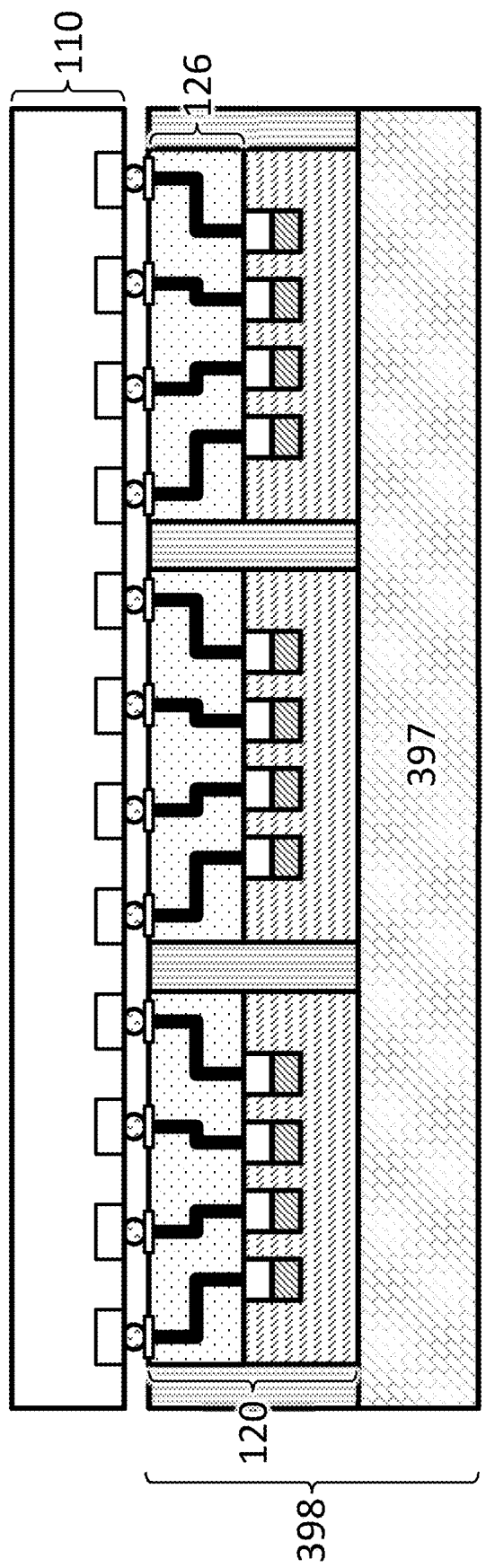

As shown in a detailed cross-sectional view of the detector 100 in FIG. 3E, according to an embodiment, multiple chips including the electronics layer 120 may be reconstructed into a wafer 398. The wafer 398 is bonded to a substrate including the X-ray absorption layer 110. The X-ray absorption layer 110 extends across the multiple chips. The electronics layer 120 in each of the chips comprises the distribution layer 126 (i.e., the distribution layer 126 and the electronics layer 120 in the same chip are formed on the same substrate). The details of the distribution layer 126 are shown in FIG. 2B.

Figure 4A:
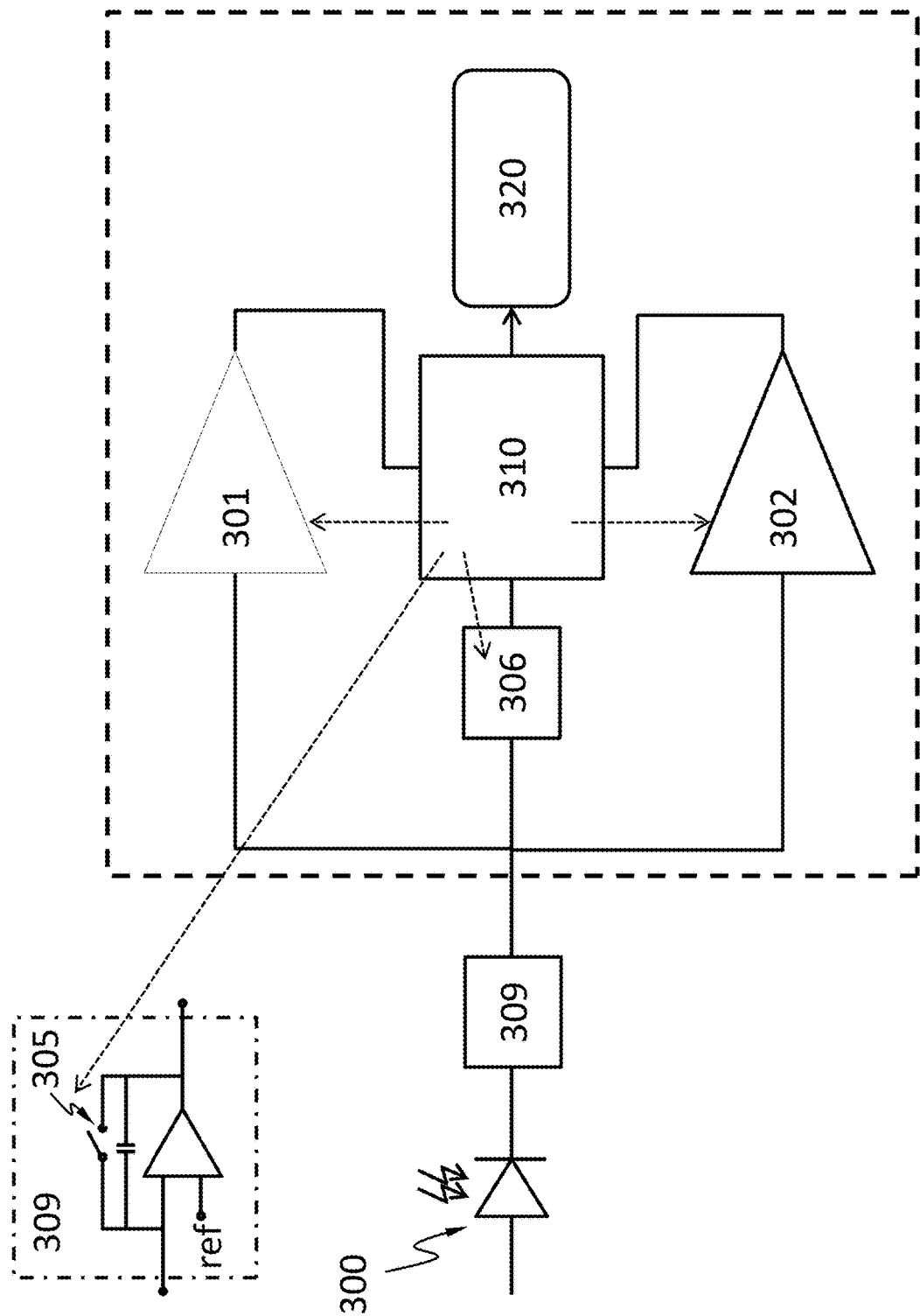
FIG. 4A and FIG. 4B each show a component diagram of an electronic system of the detector in FIG. 1B or FIG. 1C, according to an embodiment.
Figure 4B:
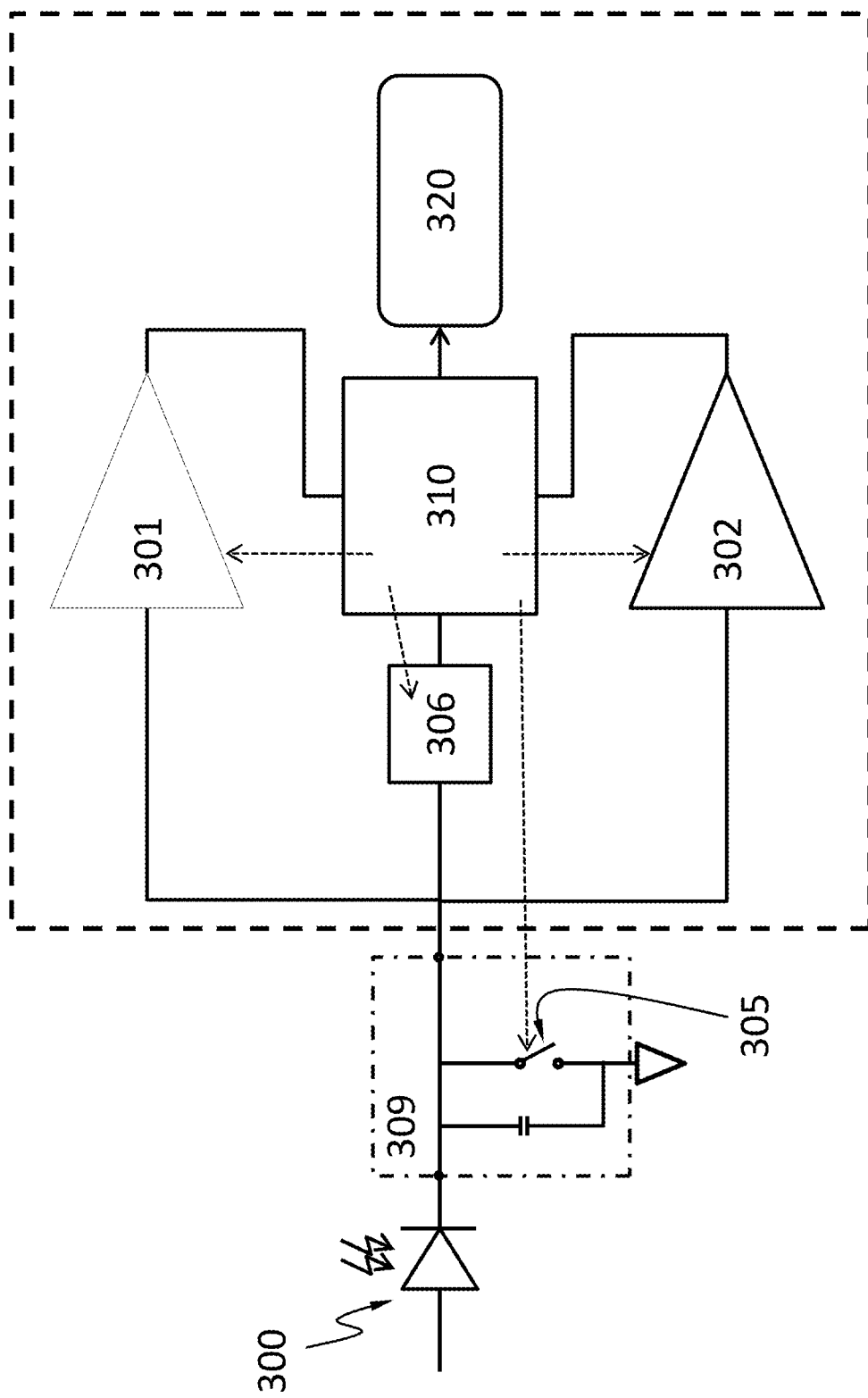

FIG. 4A and FIG. 4B each show a component diagram of the electronic system 121, according to an embodiment. The electronic system 121 may include a first voltage comparator 301, a second voltage comparator 302, a counter 320, a switch 305, a voltmeter 306 and a controller 310.

The first voltage comparator 301 is configured to compare the voltage of at least one of the electric contacts of diodes 300 or resistors (e.g., one of the first plurality of electric contacts 119B) to a first threshold. The diode may be a diode formed by the first doped region 111, one of the discrete regions 114 of the second doped region 113, and the optional intrinsic region 112. The first voltage comparator 301 may be configured to monitor the voltage directly, or calculate the voltage by integrating an electric current flowing through the electric contact of the diode or the resistor over a period of time. The first voltage comparator 301 may be controllably activated or deactivated by the controller 310. The first voltage comparator 301 may be a continuous comparator. Namely, the first voltage comparator 301 may be configured to be activated continuously, and monitor the voltage continuously. The first voltage comparator 301 configured as a continuous comparator reduces the chance that the system 121 misses signals generated by an incident X-ray photon. The first voltage comparator 301 configured as a continuous comparator is especially suitable when the incident X-ray intensity is relatively high. The first voltage comparator 301 may be a clocked comparator, which has the benefit of lower power consumption. The first voltage comparator 301 configured as a clocked comparator may cause the system 121 to miss signals generated by some incident X-ray photons. When the incident X-ray intensity is low, the chance of missing an incident X-ray photon is low because the time interval between two successive photons is relatively long. Therefore, the first voltage comparator 301 configured as a clocked comparator is especially suitable when the incident X-ray intensity is relatively low. The first threshold may be 5-10%, 10%-20%, 20-30%, 30-40% or 40-50% of the maximum voltage one incident X-ray photon may generate in the diode or the resistor. The maximum voltage may depend on the energy of the incident X-ray photon (i.e., the wavelength of the incident X-ray), the material of the X-ray absorption layer 110, and other factors. For example, the first threshold may be 50 mV, 100 mV, 150 mV, or 200 mV.

The second voltage comparator 302 is configured to compare the voltage to a second threshold. The second voltage comparator 302 may be configured to monitor the voltage directly, or calculate the voltage by integrating an electric current flowing through the electric contact of the diode or the resistor over a period of time. The second voltage comparator 302 may be a continuous comparator. The second voltage comparator 302 may be controllably activate or deactivated by the controller 310. When the second voltage comparator 302 is deactivated, the power consumption of the second voltage comparator 302 may be less than 1%, less than 5%, less than 10% or less than 20% of the power consumption when the second voltage comparator 302 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, \text{ if } x \geq 0 \\ -x, \text{ if } x \leq 0 \end{cases}.$$

The second threshold may be 200%-300% of the first threshold. The second threshold may be at least 50% of the maximum voltage one incident X-ray photon may generate in the diode or resistor. For example, the second threshold may be 100 mV, 150 mV, 200 mV, 250 mV or 300 mV. The second voltage comparator 302 and the first voltage comparator 310 may be the same component. Namely, the system 121 may have one voltage comparator that can compare a voltage with two different thresholds at different times.

The first voltage comparator 301 or the second voltage comparator 302 may include one or more op-amps or any other suitable circuitry. The first voltage comparator 301 or the second voltage comparator 302 may have a high speed to allow the system 121 to operate under a high flux of incident X-ray. However, having a high speed is often at the cost of power consumption.

The counter 320 is configured to register a number of X-ray photons reaching the diode or resistor. The counter 320 may be a software component (e.g., a number stored in a computer memory) or a hardware component (e.g., a 4017 IC and a 7490 IC).

The controller 310 may be a hardware component such as a microcontroller and a microprocessor. The controller 310 is configured to start a time delay from a time at which the first voltage comparator 301 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on whether the voltage of the cathode or the anode of the diode or which electric contact is used. The controller 310 may be configured to keep deactivated the second voltage comparator 302, the counter 320 and any other circuits the operation of the first voltage comparator 301 does not require, before the time at which the first voltage comparator 301 determines that the absolute value of the voltage equals or exceeds the absolute value of the first threshold. The time delay may expire before or after the voltage becomes stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns.

The controller 310 may be configured to activate the second voltage comparator during (including the beginning and the expiration) the time delay. In an embodiment, the controller 310 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 310 itself may be deactivated until the output of the first voltage comparator 301 activates the controller 310 when the absolute value of the voltage equals or exceeds the absolute value of the first threshold.

The controller 310 may be configured to cause the number registered by the counter 320 to increase by one, if, during the time delay, the second voltage comparator 302 determines that the absolute value of the voltage equals or exceeds the absolute value of the second threshold.

The controller 310 may be configured to cause the voltmeter 306 to measure the voltage upon expiration of the time delay. The controller 310 may be configured to connect the electric contact of the diode or the resistor to an electrical ground, so as to reset the voltage and discharge any charge carriers accumulated on the electric contact of the diode or the resistor. In an embodiment, the electric contact of the diode or the resistor is connected to an electrical ground after the expiration of the time delay. In an embodiment, the electric contact of the diode or the resistor is connected to an electrical ground for a finite reset time period. The controller 310 may connect the electric contact of the diode or the resistor to the electrical ground by controlling the switch 305. The switch may be a transistor such as a field-effect transistor (FET).

In an embodiment, the system 121 has no analog filter network (e.g., a RC network). In an embodiment, the system 121 has no analog circuitry.

The voltmeter 306 may feed the voltage it measures to the controller 310 as an analog or digital signal.

Figure 5:
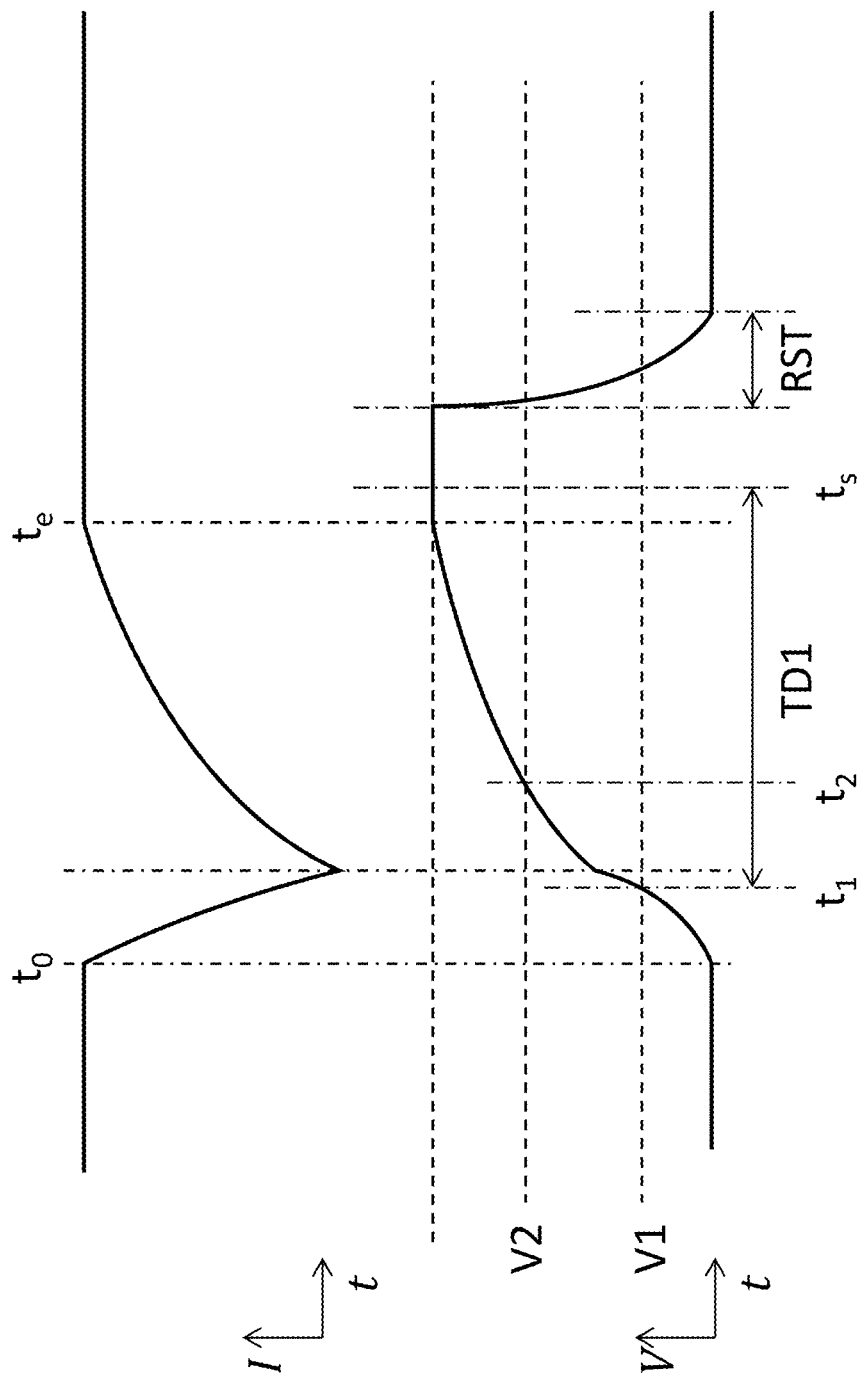
FIG. 5 schematically shows a temporal change of the electric current flowing through an electric contact (upper curve) of a diode a resistor of an X-ray absorption layer exposed to X-ray, the electric current caused by charge carriers generated by an X-ray photon incident on the X-ray absorption layer, and a corresponding temporal change of the voltage of the electric contact (lower curve), according to an embodiment.

The system 121 may include capacitor modules 309 electrically connected to the electric contacts of the diodes 300 or the resistors (e.g., the first plurality of electric contacts 119B). The capacitor modules 309 are configured to respectively collect charge carriers from the electric contacts of the diodes or the resistors. Each of the capacitor modules can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from one of the electric contacts of the diodes or the resistors accumulate on the capacitor over a period of time ("integration period") (e.g., as shown in FIG. 5, between $t_0$ to $t_1$, or $t_1$-$t_2$). After the integration period has expired, the capacitor voltage is sampled and then reset by a reset switch. Each of the capacitor modules may include a capacitor directly connected to each of the electric contacts of the diodes or the resistors. The capacitor modules 309 may be configured to compensate for variation in capacitances of circuits between the capacitor modules 309 and the electric contacts of the diodes or the resistors (e.g., by adjusting the capacitance of the capacitor of each of the capacitor modules 309).

FIG. 5 schematically shows a temporal change of the electric current flowing through one of the electric contacts of the diodes or the resistors (upper curve) caused by charge carriers generated by an X-ray photon incident on the diode or the resistor, and a corresponding temporal change of the voltage of the electric contact of the diode or the resistor (lower curve). The voltage may be an integral of the electric current with respect to time. At time $t_0$, the X-ray photon hits the diode or the resistor, charge carriers start being generated in the diode or the resistor, electric current starts to flow through the electric contact of the diode or the resistor, and the absolute value of the voltage of the electric contact starts to increase. At time $t_1$, the first voltage comparator 301 determines that the absolute value of the voltage equals or exceeds the absolute value of the first threshold V1, and the controller 310 starts the time delay TD1 and the controller 310 may deactivate the first voltage comparator 301 at the beginning of TD1. If the controller 310 is deactivated before $t_1$, the controller 310 is activated at $t_1$. During TD1, the controller 310 activates the second voltage comparator 302. The term "during" a time delay as used here means the beginning and the expiration (i.e., the end) and any time in between. For example, the controller 310 may activate the second voltage comparator 302 at the expiration of TD1. If during TD1, the second voltage comparator 302 determines that the absolute value of the voltage equals or exceeds the absolute value of the second threshold at time $t_2$, the controller 310 causes the number registered by the counter 320 to increase by one. At time $t_e$, all charge carriers generated by the X-ray photon drift out of the X-ray absorption layer 110. At time $t_s$, the time delay TD1 expires. In the example of FIG. 5, time $t_s$ is after time $t_e$; namely TD1 expires after all charge carriers generated by the X-ray photon drift out of the X-ray absorption layer 110. The rate of change of the voltage is thus substantially zero at $t_s$. The controller 310 may be configured to deactivate the second voltage comparator 302 at expiration of TD1 or at $t_2$, or any time in between.

The controller 310 may be configured to cause the voltmeter 306 to measure the voltage upon expiration of the time delay TD1. In an embodiment, the controller 310 causes the voltmeter 306 to measure the voltage after the rate of change of the voltage becomes substantially zero after the expiration of the time delay TD1. The voltage at this moment is proportional to the amount of charge carriers generated by an X-ray photon, which relates to the energy of the X-ray photon. The controller 310 may be configured to determine the energy of the X-ray photon based on voltage the voltmeter 306 measures. In an embodiment, the controller 310 may be configured to determine the X-ray photon energy by multiplying a factor to the value of the voltage measured upon expiration of the time delay TD1, wherein the factor is determined based on capacitances of circuits between the electronics system 121 and the electric contacts of the diodes or the resistors. One way to determine the energy is by binning the voltage. The counter 320 may have a sub-counter for each bin. When the controller 310 determines that the energy of the X-ray photon falls in a bin, the controller 310 may cause the number registered in the sub-counter for that bin to increase by one. Therefore, the system 121 may be able to detect an X-ray image and may be able to resolve X-ray photon energies of each X-ray photon.

After TD1 expires, the controller 310 connects the electric contact of the diode or the resistor to an electric ground for a reset period RST to allow charge carriers accumulated on the electric contact of the diode or the resistor to flow to the ground and reset the voltage. After RST, the system 121 is ready to detect another incident X-ray photon. Implicitly, the rate of incident X-ray photons the system 121 can handle in the example of FIG. 5 is limited by 1/(TD1+RST). If the first voltage comparator 301 has been deactivated, the controller 310 can activate it at any time before RST expires. If the controller 310 has been deactivated, it may be activated before RST expires.

Figure 6:
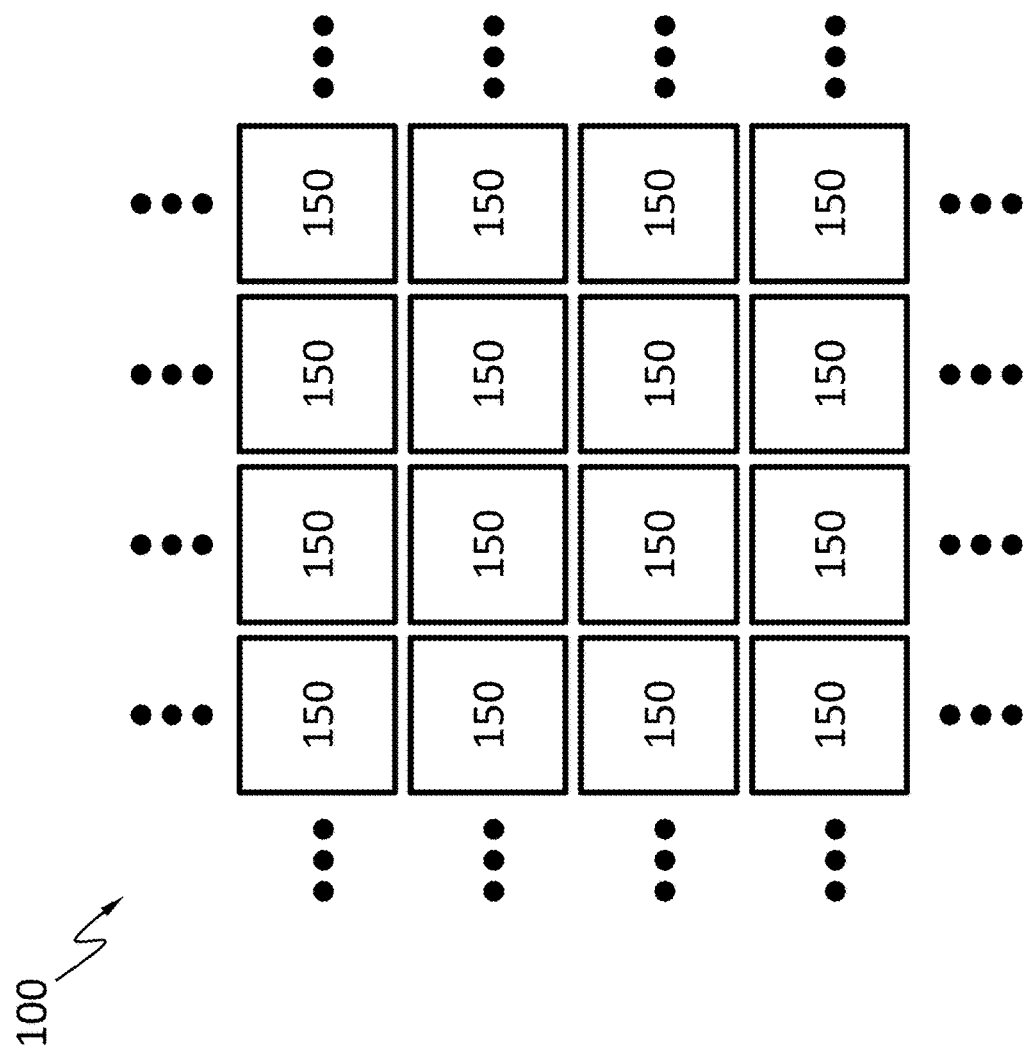
FIG. 6 schematically shows that the detector may have an array of pixels, according to an embodiment.

FIG. 6 schematically shows that the detector 100 may have an array of pixels 150. The array may be a rectangular array, a honeycomb array, a hexagonal array or any other suitable array. A pixel 150 may associate with an area around a discrete region 114 of the X-ray absorption layer 110 including diodes or an area around one of the first plurality of electric contacts 119B of the X-ray absorption layer 110 including resistors but not diodes. Substantially all (more than 98%, more than 99.5%, more than 99.9%, or more than 99.99% of) charge carriers generated by an X-ray photon incident in that area flow to the discrete region 114 or the electric contact 119B. Namely, less than 2%, less than 1%, less than 0.1%, or less than 0.01% of these charge carriers flow beyond the pixel associated with the discrete region 114 or the electric contact 119B. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels.

Each pixel 150 may be configured to detect an X-ray photon incident thereon, measure the energy of the X-ray photon, or both. For example, each pixel 150 may be configured to count numbers of X-ray photons incident thereon whose energy falls in a plurality of bins, within a period of time. All the pixels 150 may be configured to count the numbers of X-ray photons incident thereon within a plurality of bins of energy within the same period of time. Each pixel 150 may have its own analog-to-digital converter (ADC) configured to digitize an analog signal representing the energy of an incident X-ray photon into a digital signal. The ADC may have a resolution of 10 bits or higher. Each pixel 150 may be configured to measure its dark current, such as before or concurrently with each X-ray photon incident thereon. Each pixel 150 may be configured to deduct the contribution of the dark current from the energy of the X-ray photon incident thereon. The pixels 150 may be configured to operate in parallel. For example, when one pixel 150 measures an incident X-ray photon, another pixel 150 may be waiting for an X-ray photon to arrive. The pixels 150 may be but do not have to be individually addressable.

What is claimed is:

1. An apparatus suitable for detecting X-ray, comprising:
    an X-ray absorption layer comprising a first plurality of electric contacts and configured to generate electrical signals on the first plurality of electric contacts from X-ray incident on the X-ray absorption layer;
    an electronics layer comprising a second plurality of electric contacts and an electronic system, wherein the electric system electrically connects to the second plurality of electric contacts and is configured to process or interpret the electrical signals;
    a distribution layer configured to electrically connect the first plurality of electric contacts to the second plurality of electric contacts, wherein the X-ray absorption layer or the electronics layer comprises the distribution layer;
    wherein the first plurality of electric contacts and the second plurality of electric contacts have different spatial distributions;
    wherein the electronic system comprises:
    a first voltage comparator configured to compare a voltage of at least one electric contact of the first plurality of electric contacts to a first threshold;
    a second voltage comparator configured to compare the voltage to a second threshold;
    a counter configured to register a number of X-ray photons reaching the absorption layer;
    a controller;
    wherein the controller is configured to start a time delay from a time at which the first voltage comparator determines that an absolute value of the voltage equals or exceeds an absolute value of the first threshold;
    wherein the controller is configured to activate the second voltage comparator during the time delay;

wherein the controller is configured to cause the number registered by the counter to increase by one, if the second voltage comparator determines that an absolute value of the voltage equals or exceeds an absolute value of the second threshold.

2. The apparatus of claim 1, wherein a number density of the first plurality of electric contacts is lower than a number density of the second plurality of electric contacts.

3. The apparatus of claim 1, wherein the X-ray absorption layer comprises the distribution layer.

4. The apparatus of claim 3, wherein the distribution layer comprises a plurality of vias aligned and connected to the first plurality of electric contacts.

5. The apparatus of claim 4, wherein the distribution layer further comprises a plurality of conductive pads, wherein the vias are connected to the conductive pads.

6. The apparatus of claim 5, wherein the second plurality of electric contacts are bonded to the conductive pads.

7. The apparatus of claim 1, wherein the electronics layer comprises the distribution layer.

8. The apparatus of claim 7, wherein the distribution layer comprises a plurality of vias aligned and connected to the second plurality of electric contacts.

9. The apparatus of claim 8, wherein the distribution layer further comprises a plurality of conductive pads, wherein the vias are connected to the conductive pads.

10. The apparatus of claim 9, wherein the first plurality of electric contacts are bonded to the conductive pads.

11. The apparatus of claim 1, wherein the electronic system further comprises a plurality of capacitor modules, each of which is electrically connected to one of the first plurality of electric contacts, wherein the capacitor modules are configured to respectively collect charge carriers from the first plurality of electric contacts.

12. The apparatus of claim 11, where the capacitor modules are configured to compensate for variation in capacitances of circuits between the capacitor modules and the first plurality of electric contacts.

13. The apparatus of claim 1, wherein the controller is configured to activate the second voltage comparator at a beginning or expiration of the time delay.

14. The apparatus of claim 1, wherein the electronic system further comprises a voltmeter, wherein the controller is configured to cause the voltmeter to measure the voltage upon expiration of the time delay.

15. The apparatus of claim 14, wherein the controller is configured to determine an X-ray photon energy based on a value of the voltage measured upon expiration of the time delay.

16. The apparatus of claim 15, wherein the controller is configured to determine the X-ray photon energy by multiplying a factor to the value of the voltage measured upon expiration of the time delay, wherein the factor is determined based on capacitances of circuits between the electronic system and the first plurality of electric contacts.

17. The apparatus of claim 1, wherein the controller is configured to connect the electric contact to an electrical ground.

18. The apparatus of claim 1, wherein a rate of change of the voltage is substantially zero at expiration of the time delay.

19. The apparatus of claim 1, wherein a rate of change of the voltage is substantially non-zero at expiration of the time delay.

20. An apparatus suitable for detecting X-ray, comprising:
an X-ray absorption layer comprising a first plurality of electric contacts and configured to generate electrical signals on the first plurality of electric contacts from X-ray incident on the X-ray absorption layer;
an electronics layer comprising a second plurality of electric contacts and an electronic system, wherein the electric system electrically connects to the second plurality of electric contacts and is configured to process or interpret the electrical signals;
wherein the first plurality of electric contacts and the second plurality of electric contacts have different spatial distributions;
a board comprising a distribution layer, wherein the distribution layer is configured to electrically connect the first plurality of electric contacts to the second plurality of electric contacts, wherein at least one of the X-ray absorption layer and the electronics layer is embedded in the board, wherein the board comprises an electrically insulating material;
wherein the electronic system comprises:
a first voltage comparator configured to compare a voltage of at least one electric contact of the first plurality of electric contacts to a first threshold;
a second voltage comparator configured to compare the voltage to a second threshold;
a counter configured to register a number of X-ray photons reaching the absorption layer;
a controller;
wherein the controller is configured to start a time delay from a time at which the first voltage comparator determines that an absolute value of the voltage equals or exceeds an absolute value of the first threshold;
wherein the controller is configured to activate the second voltage comparator during the time delay;
wherein the controller is configured to cause the number registered by the counter to increase by one, if the second voltage comparator determines that an absolute value of the voltage equals or exceeds an absolute value of the second threshold.

21. The apparatus of claim 20, wherein a number density of the first plurality of electric contacts is lower than a number density of the second plurality of electric contacts.

22. The apparatus of claim 20, wherein the absorption layer is embedded in the board.

23. The apparatus of claim 22, wherein the distribution layer comprises a plurality of vias aligned and connected to the first plurality of electric contacts.

24. The apparatus of claim 23, wherein the distribution layer further comprises a plurality of conductive pads, wherein the vias are connected to the conductive pads.

25. The apparatus of claim 24, wherein the second plurality of electric contacts are bonded to the conductive pads.

26. The apparatus of claim 20, wherein the electronics layer is embedded in the board.

27. The apparatus of claim 26, wherein the distribution layer comprises a plurality of vias aligned and connected to the second plurality of electric contacts.

28. The apparatus of claim 27, wherein the distribution layer further comprises a plurality of conductive pads, wherein the vias are connected to the conductive pads.

29. The apparatus of claim 28, wherein the first plurality of electric contacts are bonded to the conductive pads.

30. The apparatus of claim 20, wherein the electrically insulating material is a resin, a fiberglass, a plastic, or a ceramic.

31. The apparatus of claim 20, wherein the board is flexible.

32. The apparatus of claim 20, wherein the controller is configured to activate the second voltage comparator at a beginning or expiration of the time delay.

* * * * *